United States Patent
Chen

[11] Patent Number: 6,091,237
[45] Date of Patent: Jul. 18, 2000

[54] THREE-PHRASE CLAMP-TYPE POWER METER

[76] Inventor: Lee-Fei Chen, 5Fl., No. 30, Sec. 2, Hsin-I Rd., Taipei, Taiwan

[21] Appl. No.: 09/395,350

[22] Filed: Sep. 14, 1999

[51] Int. Cl.[7] .................................................. G01R 7/00
[52] U.S. Cl. ........................ 324/142; 324/126; 324/127; 324/141; 324/142
[58] Field of Search ................................... 324/126, 127, 324/142, 141

[56] References Cited

U.S. PATENT DOCUMENTS

| D. 332,574 | 1/1993 | Chang | 324/126 |
| 4,283,677 | 8/1981 | Niwa | 324/127 |
| 5,349,289 | 9/1994 | Shirai | 324/127 |
| 5,610,512 | 3/1997 | Selcuk | 324/127 |

*Primary Examiner*—Safet Metjahic
*Assistant Examiner*—Jimmy Nguyen
*Attorney, Agent, or Firm*—Rosenberg, Klein & Lee

[57] ABSTRACT

A three-phase clamp-type power meter comprises a main body suitable to be held by hand during operation, a clamp assembly to clamp around an external power line to measure the current flowing in the power line, two test terminals on the main body for connecting two external power lines to measure a voltage across them, an operating unit for generating a result from the current and the voltage measured through the clamp assembly and the two test terminals with a memory unit for storing the result, and a display unit for displaying at least one of the current, the voltage and the result.

9 Claims, 9 Drawing Sheets

THREE-PHRASE CLAMP-TYPE POWER METER

BACKGROUND OF THE INVENTION

1. Field of the Invention

The present invention relates to a power meter, and particularly to a three-phase clamp-type power meter in the form of a hand tool suitable for measuring 3-phase, 3-line or 3-phase, 4-line AC/DC unbalanced power, and has the advantages of low cost, light weight, memory, dual-numeral display, etc.

2. Description of the Prior Art

Measuring voltage, current or power frequently occurs in daily life as well as in industry so that various kinds of electric meters have been developed as needed, for example, the widely-used multimeter which was developed mainly for simple measurements. However, the multimeter is only suitable for measuring small ranges of voltage and current. For measuring a high voltage or current, using the multimeter becomes quite dangerous and, in fact, some circumstances do not allow the user to perform measurements simply by test lines.

Furthermore, for subscribers requiring high power, it is important to frequently monitor the power factor, that is, the ratio between the real power actually used and the input apparent power, to enhance the performance of their internal circuitry and to save on power consumption. Thus, there is a need of an excellent and reliable power meter for users to measure the power factor, particularly in the high power environments.

Digital electric meters have been developed and are capable of displaying the measured data on a display such as an LCD (Liquid Crystal Display). However, just like the multimeter, most of the digital electric meters have been developed for low voltage applications or simple requirements and, thus, the range of applicable use is limited.

An example is given below to further explain existing electric meters. As shown in FIG. 9, the PA-2000 power analyzer 50 produced by Musashi Inc., Japan, is described below. The power analyzer 50 essentially includes: an operating unit (not shown) inside the analyzer 50; voltage test line assemblies 51, 52; current test line assemblies 53, 54; temperature-sensing terminals 55; a display 56; an RS-232 interface port 57; a power switch 58; a printing device 59; and a handle 501 provided on the front end of the power analyzer 50 for the user to carry the analyzer 50.

One voltage test line assembly 51 comprises three lines for measuring a 3-phase, 3-line voltage, and the other voltage test line assembly 52 comprises four lines for measuring a 3-phase, 4-line voltage. One current test line assembly 53 comprises two lines for measuring a 3-phase, 3-line current, and the other current test line assembly 54 comprises three lines for measuring a 3-phase, 4-line current.

In the case of measuring a 3-phase, 4-line power, it is necessary to use the three lines of the current test line assembly 54 to respectively clamp the three power lines respectively of R, S, T phases to measure the currents flowing therein, and to connect the four lines of the voltage test line assembly 52 to the power lines respectively of R, S, T phases as well as the ground line to measure the voltages on the R, S and T-phased lines. Then, the internal operating unit of the analyzer 50 calculates each phase's real power ($KW_R$, $KW_S$ and $KW_T$) by the equation P(power)=I(current) * V(voltage)*COS θ (θ is the phase angle between the voltage and current), so that the 3-phase, 4-line real power $KW_{3\phi 4W}$ can be obtained as below:

$$KW_{3\phi 4W} = KW_R + KW_S + KW_T$$

The result of the measurement is displayed on the display 56, and the printing device 59 can print out the measurement results.

However, the power analyzer 50 is too bulky to be an effective hand tool. The components and wiring of the analyzer 50 are also too complex, and sometimes the test line assemblies need more than one person to set them up and hold them in place during the test.

In addition, the power analyzer 50 lacks a memory capability. This is particularly inconvenient when a test requires several measurements. Also, the power analyzer 50 cannot simultaneously display dual numerals such as a voltage value plus a current value. The measurable range of the voltage, current and power of the power analyzer 50 are also insufficient.

Accordingly, there is a need for a power meter capable of measuring 3-phase, 3-line or 3-phase, 4-line power lines and the AC/DC unbalanced power on power lines with low cost, light weight, a memory capability, a dual-value display, large measurable ranges, etc.

SUMMARY OF THE INVENTION

The main object of the present invention is to overcome the above-described shortcomings that exist in the prior art.

In order to achieve the object, the present invention provides a power meter comprising: a main body adapted to be held by hand during the operation of the power meter; a clamp assembly that can clamp around an external power line to measure the current flowing in the power line; two test terminals at the main body for connecting to two external power lines to measure a voltage across the two external power lines; an operating unit that generates a result from the current and the voltage measured through the clamp assembly and the two test terminals comprises a memory unit that stores the result; and a display unit for displaying either one or two of the current, the voltage or the result.

The power meter according to the present invention can be easily operated by a single person as the power meter has the advantages of small size, simple connection and memory capability.

Further objects and advantages of the present invention will become apparent from a careful reading of the detailed description with appropriate reference to the accompanying drawings.

DETAILED DESCRIPTION OF THE PREFERRED EMBODIMENT

Figure 1:
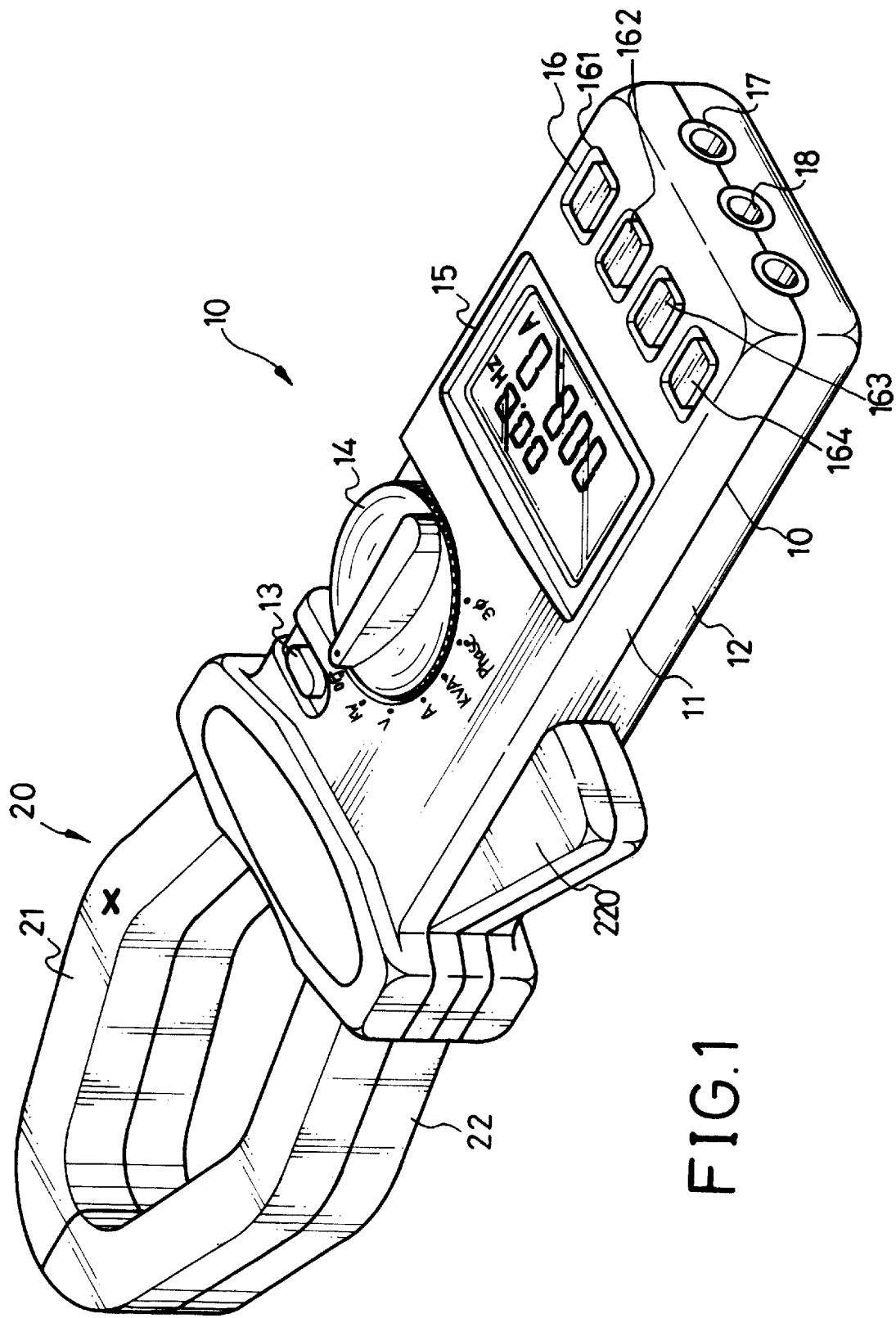
FIG. 1 is a perspective view of a power meter in accordance with the present invention.

As shown in FIG. 1, the power meter in accordance with the present invention mainly comprises a main body 10 in the form of a hand tool, a clamp assembly 20 formed at one end of the main body 10 to clamp around a power line (not shown) to measure the current flowing in the power line, and an operating unit 30 (not shown) inside the main body 10.

As shown in FIG. 1, the main body 10 is essentially comprised of an upper case 11 and a lower case 12. A hold button 13, a knob 14, a display unit 15, and a key set 16 are further provided on the face of the upper case 11.

The hold button 13 keeps a test result shown on the display unit 15. The knob 14 selects one of the testing functions of the power meter, such as power (KW), voltage (V), current (A), phase, KVA and 3-phase (3Φ), etc. The display unit 15 in this embodiment is of an LCD type and is capable of simultaneously showing two numerals, such as voltage plus current, voltage plus frequency, current plus frequency, etc.

In this embodiment, the key set 16 includes four keys which are a read/next key 161, a select key 162, a store key 163 and a zero key 164. The select key 162 is used to select between the 3-phase, 3-line test mode and the 3-phase, 4-line test mode. When the knob 14 is turned to the position 3Φ, the read/next key 161, when pressed, is used to store a test result in the memory (not shown) of the operating unit 30 and prompt the user to measure the next required value. When the knob 14 is turned to a position other than the positions 3Φ and OFF, the read/next key 161 is used to read the contents stored in the memory of the operating unit 30. The store key 163 is used to store a test result in the memory of the operating unit 30. The zero key 164 is used to zero the power meter.

Figure 2:
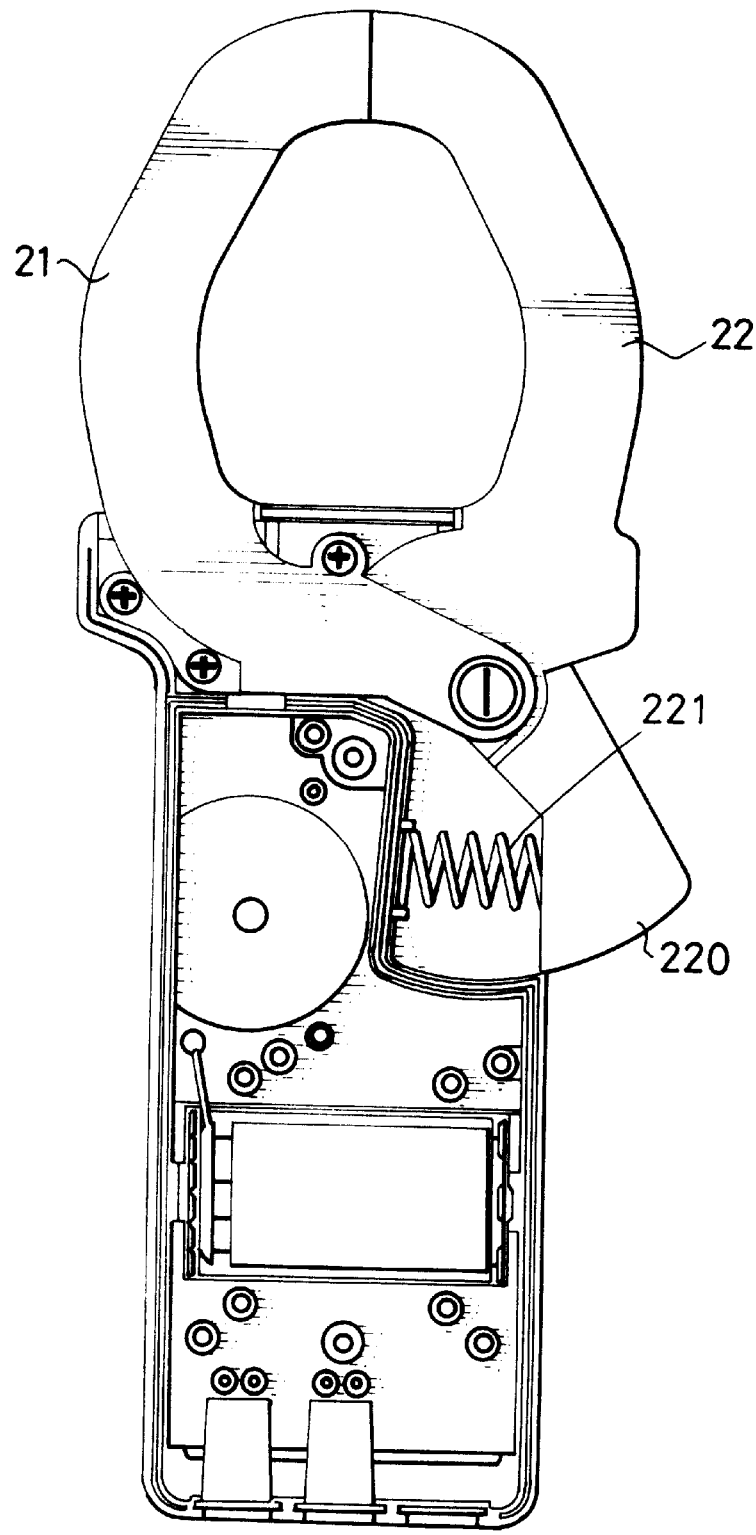
FIG. 2 is a rear plan view of the power meter in FIG. 1 with the back cover removed.

The clamp assembly 20 includes a stationary arm 21 attached to the main body 10 and a pivoting arm 22 attached in a manner that the arms 21, 22 form an enclosed loop. In this embodiment, a trigger 220 extends from one end of the pivoting arm 22 and is formed at a position on the main body where a user's thumb can readily operate this trigger 220. As long as the trigger 220 is pressed, the arms 21, 22 will be separated from each other and allow the arms 21, 22 to be clamped around a power line. Once the trigger 220 is freed, the arms 21, 22 will return to the original position as an enclosed loop by means of, for example, a spring 221 as shown in FIG. 2.

As shown in FIG. 1, a positive test jack 17 and a negative test jack 18 are provided at the rear end of the main body 10 to respectively receive a positive test line and a negative test line for testing a voltage. (Neither line is shown in FIG. 1.)

Figure 3:
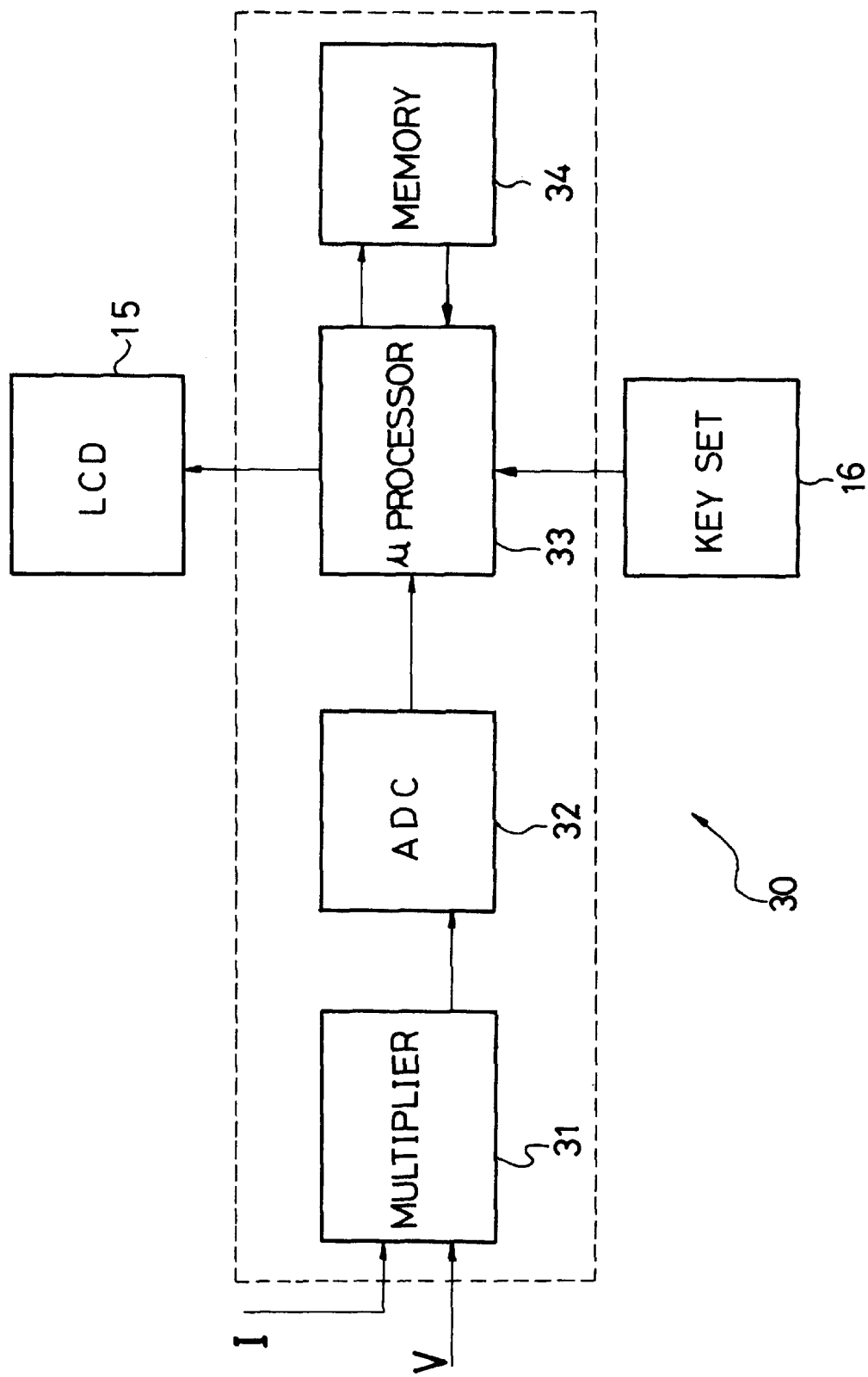
FIG. 3 is a functional block diagram of the power meter in FIG. 1.

Referring to FIG. 3, the operating unit 30 according to this embodiment includes a multiplier 31, an analog-to-digital converter (ADC) 32, a microprocessor 33, and memory 34. The multiplier 31 receives the test results obtained through the clamp assembly 20 and the test jacks 17, 18 and performs a multiplying operation on the test results. Then, the multiplied result is converted by the ADC 32 into a form that can be further processed by the microprocessor 33. If only voltage or current is required, the test results obtained through the clamp assembly 20 and the test jacks 17, 18 can be directly converted by the ADC 32 without the need of multiplication.

Figure 4:
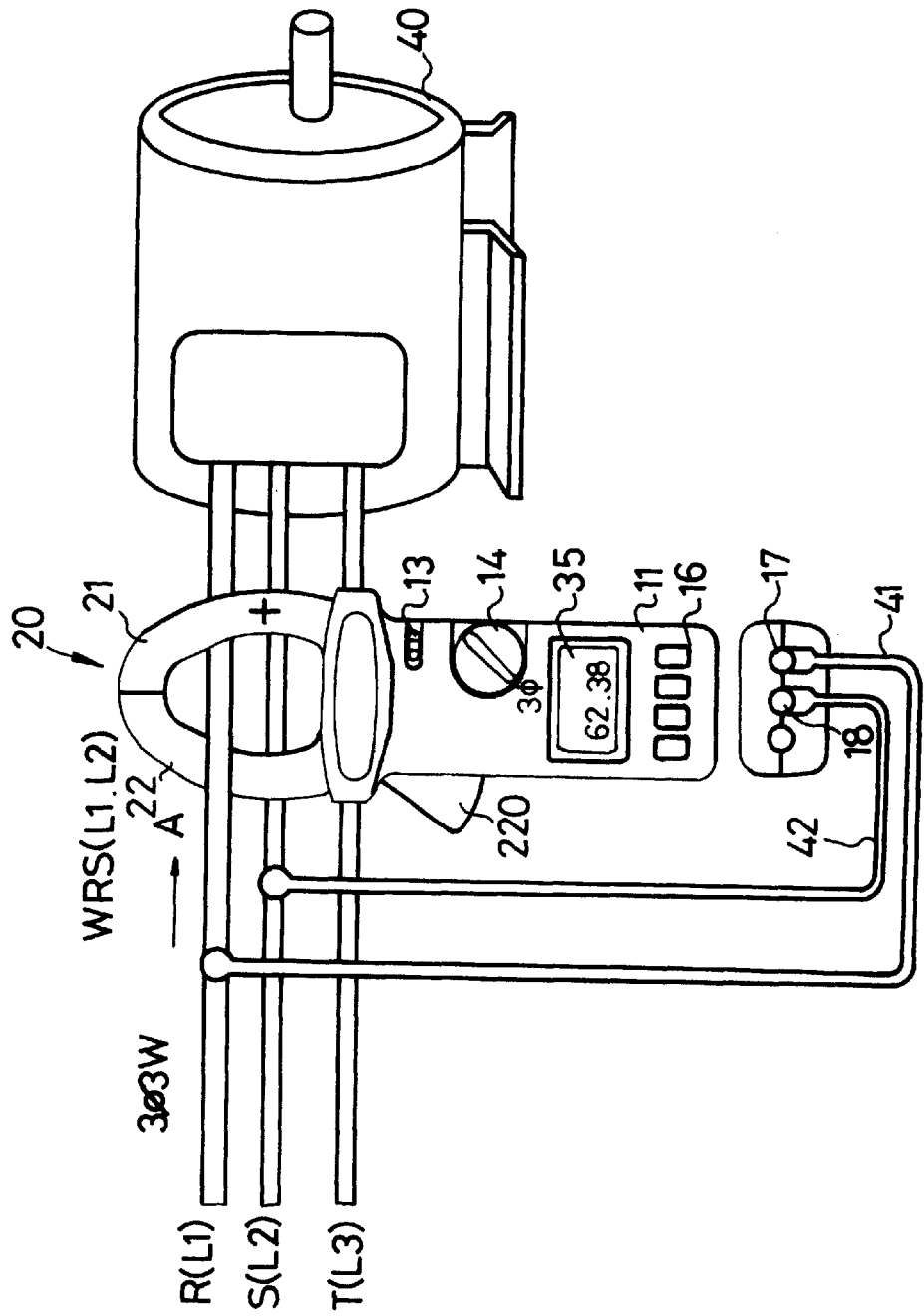
FIG. 4 is an operational view showing the first step of measuring a 3-phase, 3-line AC/DC unbalanced power by using the power meter in FIG. 1.
Figure 5:
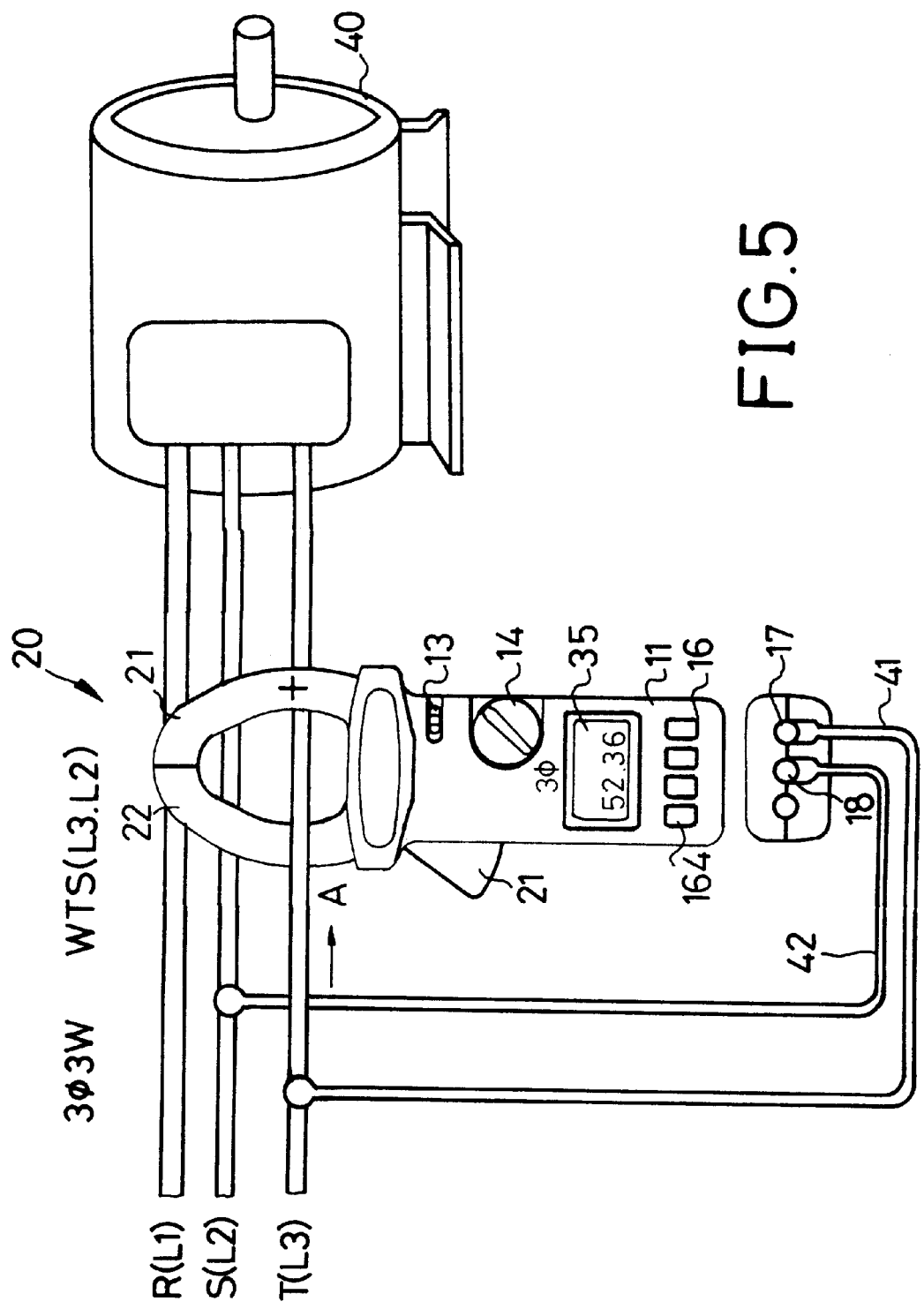
FIG. 5 is an operational view showing the second step of measuring a 3-phase, 3-line AC/DC unbalanced power by using the power meter in FIG. 1.

The operations of the operating unit 30 are best understood by illustrating some actual examples of measurements.
3-Phase, 3-Line AC/DC Unbalanced Power Reference is made to FIGS. 4 and 5. The power to be measured is represented as $KW_{3\Phi 3W}$, and the power is given by:

$$KW_{3\Phi 3W}=KW_{RS(L1L2)}+KW_{TS(L3L2)}$$

where $KW_{RS(L1L2)}$ and $KW_{TS(L3L2)}$ respectively represent the real power measured between lines R(L1), S(L2) and between lines T(L3), S(L2).

Firstly, referring to FIG. 3, the power $KW_{RS(L1L2)}$ is obtained by the steps of: turning the knob 14 to the position 3Φ, selecting the 3-phase, 3-line test mode with the select key 162, zeroing the power meter by depressing the zero key 164, electrically connecting the positive test jack 17 and the negative test jack 18 respectively to lines R(L1), S(L2) by means of test lines 41, 42, and clamping the clamp assembly 20 around line R(L1).

Once the test configuration shown in FIG. 4 is set, the power meter will automatically calculate the test results using the data obtained through the clamp assembly 20 and the jacks 17, 18 and obtain and display the power $KW_{RS(L1L2)}$ from the results on the display unit 15.

After the power $KW_{RS(L1L2)}$ is obtained and shown on the display unit 15, pressing the read/next key 161 will store the power $KW_{RS(L1L2)}$ in the memory 34 of the operating unit 30 and prompt the user to prepare the next measurement, the power $KW_{TS(L3L2)}$ in this example.

Referring to FIG. 5, the power $KW_{TS(L3L2)}$ is obtained by: removing the test lines 41, 42 and the clamp assembly 20 from lines R(L1) and S(L2), zeroing the power meter by pressing the zero key 164, electrically connecting the positive test jack 17 and the negative test jack 18 respectively to lines T(L3) and S(L2) by means of test lines 41, 42, and clamping the clamp assembly 20 around line T(L3). Similarly, Once the test configuration shown in FIG. 5 is set, the power meter of this invention will automatically calculate the test results using the data obtained through the clamp assembly 20 and the jacks 17, 18 and obtain and display the power $KW_{TS(L3L2)}$ on the display unit 15.

After the power $KW_{TS(L3L2)}$ is obtained and shown on the display unit 15, pressing the read/next key 161 will store the power $KW_{TS(L3L2)}$ in the memory 34 of the operating unit 30. In this embodiment, the user then will be prompted to press the read/next key 161 to further make the operating unit 30 sum the two powers stored in the memory 34, and the sum, that is, $KW_{3\Phi 3W}$, will be shown on the display unit 15.
3-Phase, 4-Line AC/DC Unbalanced Power The power to be measured is represented as $KW_{3\Phi 4W}$, and the power is given by:

$$KW_{3\Phi 4W}=KW_{R(L1)}+KW_{S(L2)}+KW_{T(L3)}$$

where $KW_{R(L1)}$, $KW_{S(L2)}$ and $KW_{T(L3)}$ respectively represent the real power measured at lines R(L1), S(L2) and T(L3). Thus, in order to obtain the power $KW_{3\Phi 4W}$, three measurements will be required.

Figure 6:
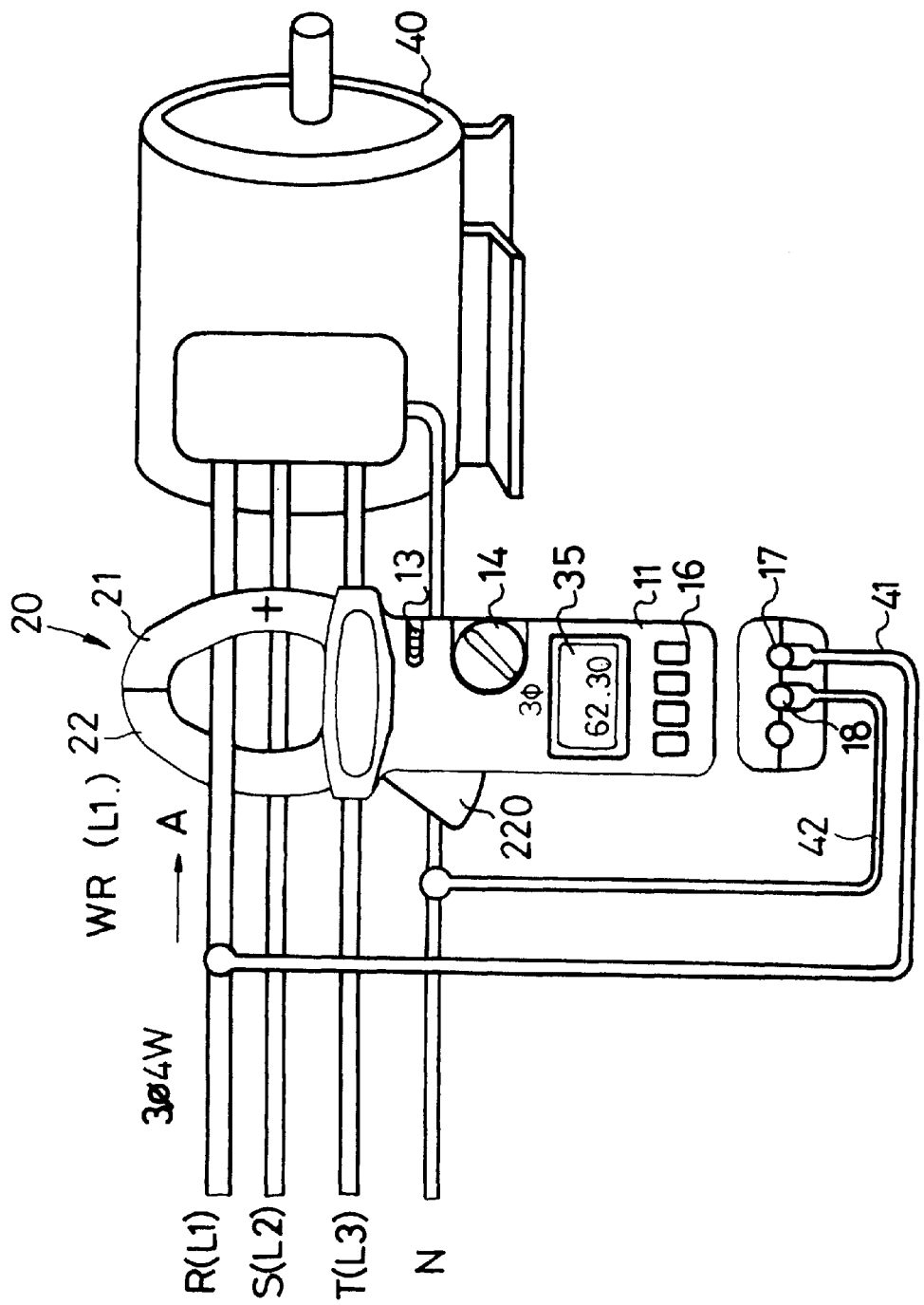
FIG. 6 is an operational view showing the measurement of the first phase of a 3-phase, 4-line AC/DC unbalanced power by using the power meter in FIG. 1.

As shown in FIG. 6, the power $KW_{3\Phi 4W}$ is obtained by: turning the knob 14 to the position 3Φ, selecting the 3-phase, 4-line test mode with the select key 162, zeroing the power meter with the zero key 164, electrically connecting the positive test jack 17 and the negative test jack 18 respectively to lines R(L1) and N by means of test lines 41, 42, and clamping the clamp assembly 20 around line R(L1).

Once the test configuration shown in FIG. 6 is set, the power meter will automatically calculate the test results using the data obtained through the clamp assembly 20 and the jacks 17, 18 and obtain and display the power $KW_{R(L1)}$ from the results.

After the power $KW_{R(L1)}$ is calculated and shown on the display unit 15, pressing the read/next key 161 will store the power $KW_{R(L1)}$ in the memory 34 of the operating unit 30 and prompt the user to prepare the next measurement, the power $KW_{S(L2)}$ in this example.

Figure 7:
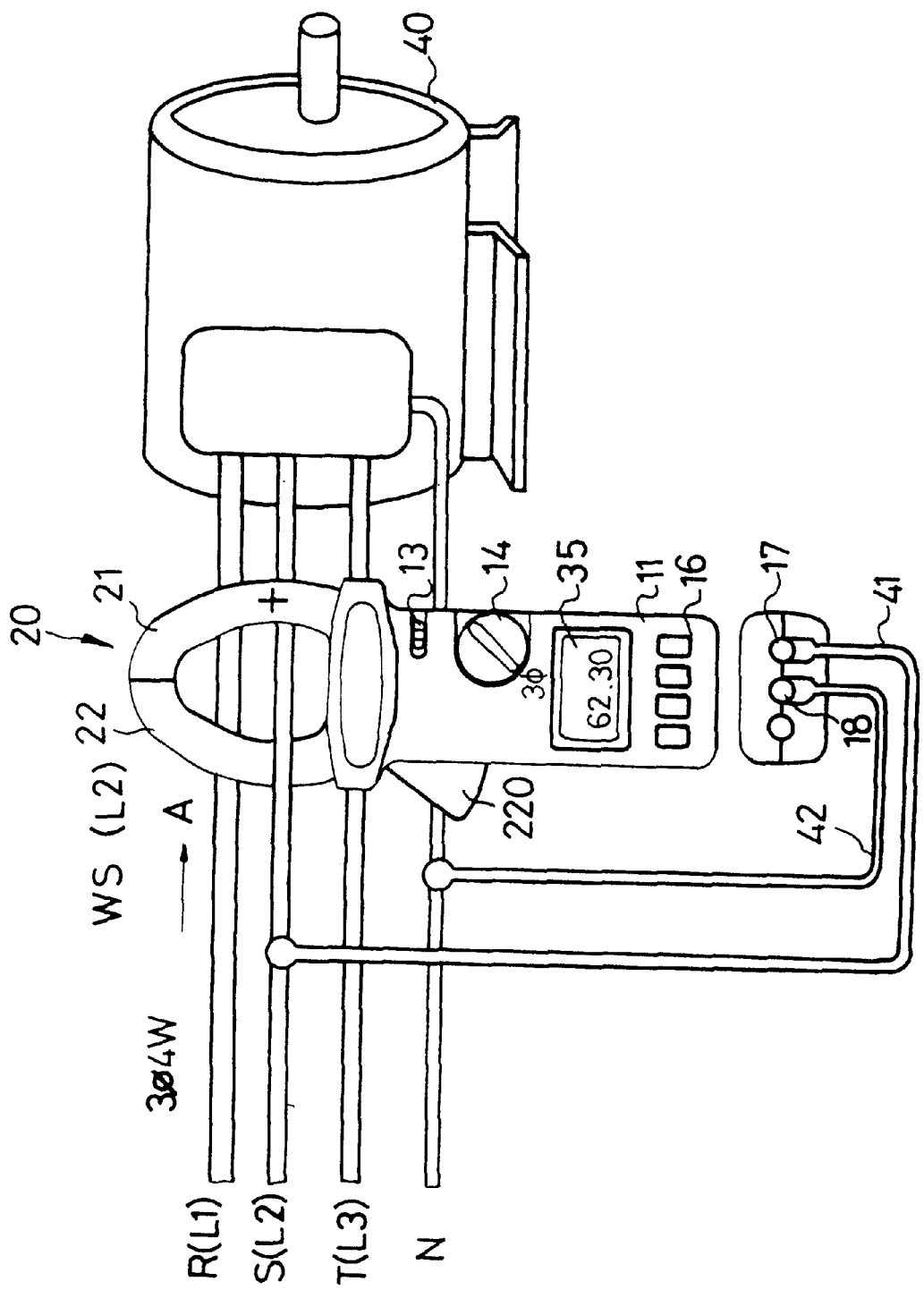
FIG. 7 is an operational view showing the measurement of the second phase of a 3-phase, 4-line AC/DC unbalanced power by using the power meter in FIG. 1.

Referring to FIG. 7, the power $KW_{S(L2)}$ is obtained by: removing the test lines 41, 42 and the clamp assembly 20 from around lines R(L1) and N, zeroing the power meter by pressing the zero key 164, electrically connecting the positive test jack 17 and the negative test jack 18 respectively to lines S(L2) and N by means of test lines 41, 42, and clamping the clamp assembly 20 around line S(L2).

Once the test configuration shown in FIG. 7 is set, the power meter will automatically calculate the test results using the data obtained through the clamp assembly 20 and the jacks 17, 18 and obtain the power $KW_{S(L2)}$. After the power $KW_{S(L2)}$ is obtained and shown on the display unit 15, pressing the read/next key 161 will store the power $KW_{S(L2)}$ in the memory 34 of the operating unit 30 and prompt the user to prepare the next measurement, the power $KW_{T(L3)}$ in this example.

Figure 8:
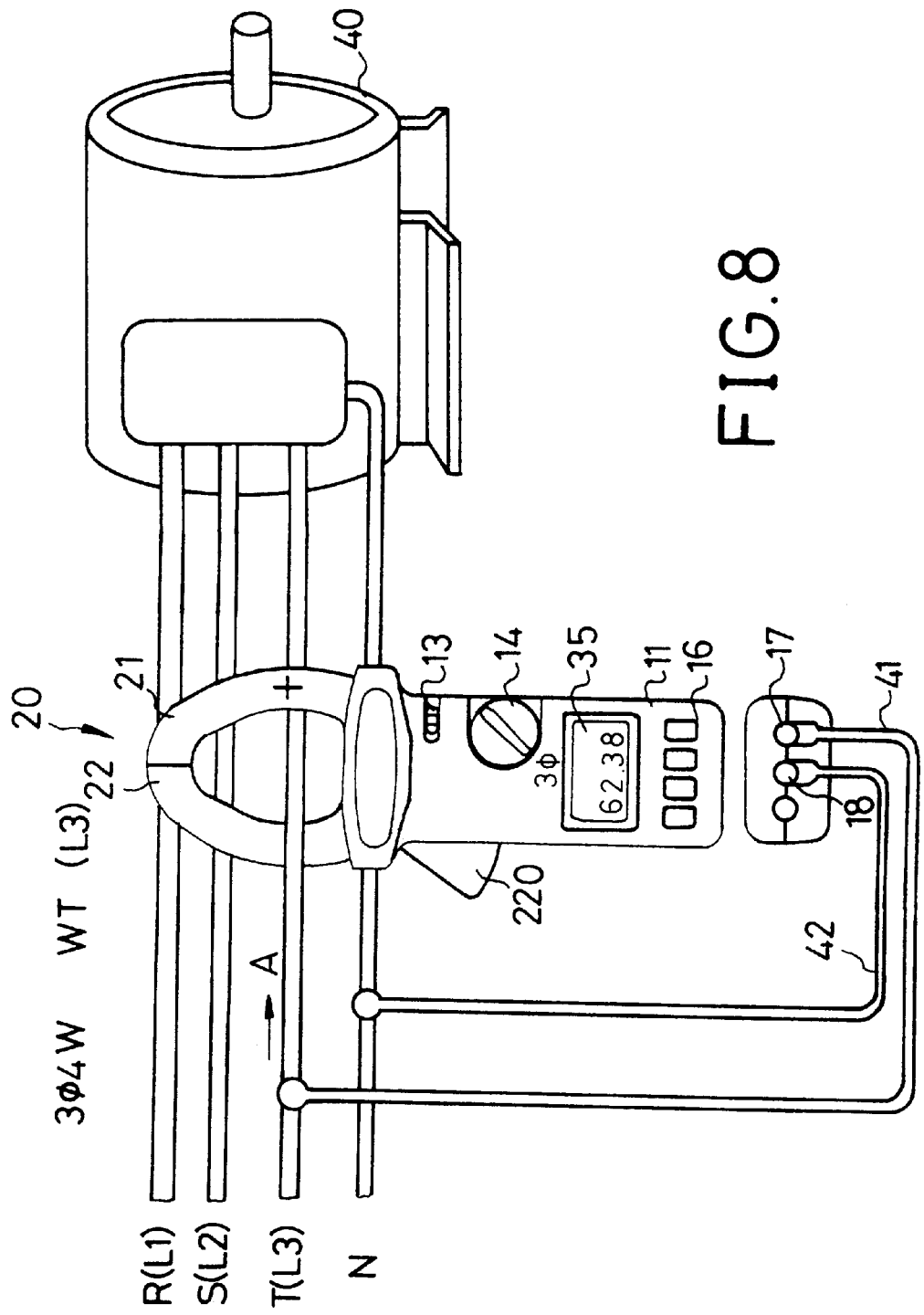
FIG. 8 is an operational view showing the measurement of the third phase of a 3-phase, 4-line AC/DC unbalanced power by using the power meter in FIG. 1.
Figure 9:
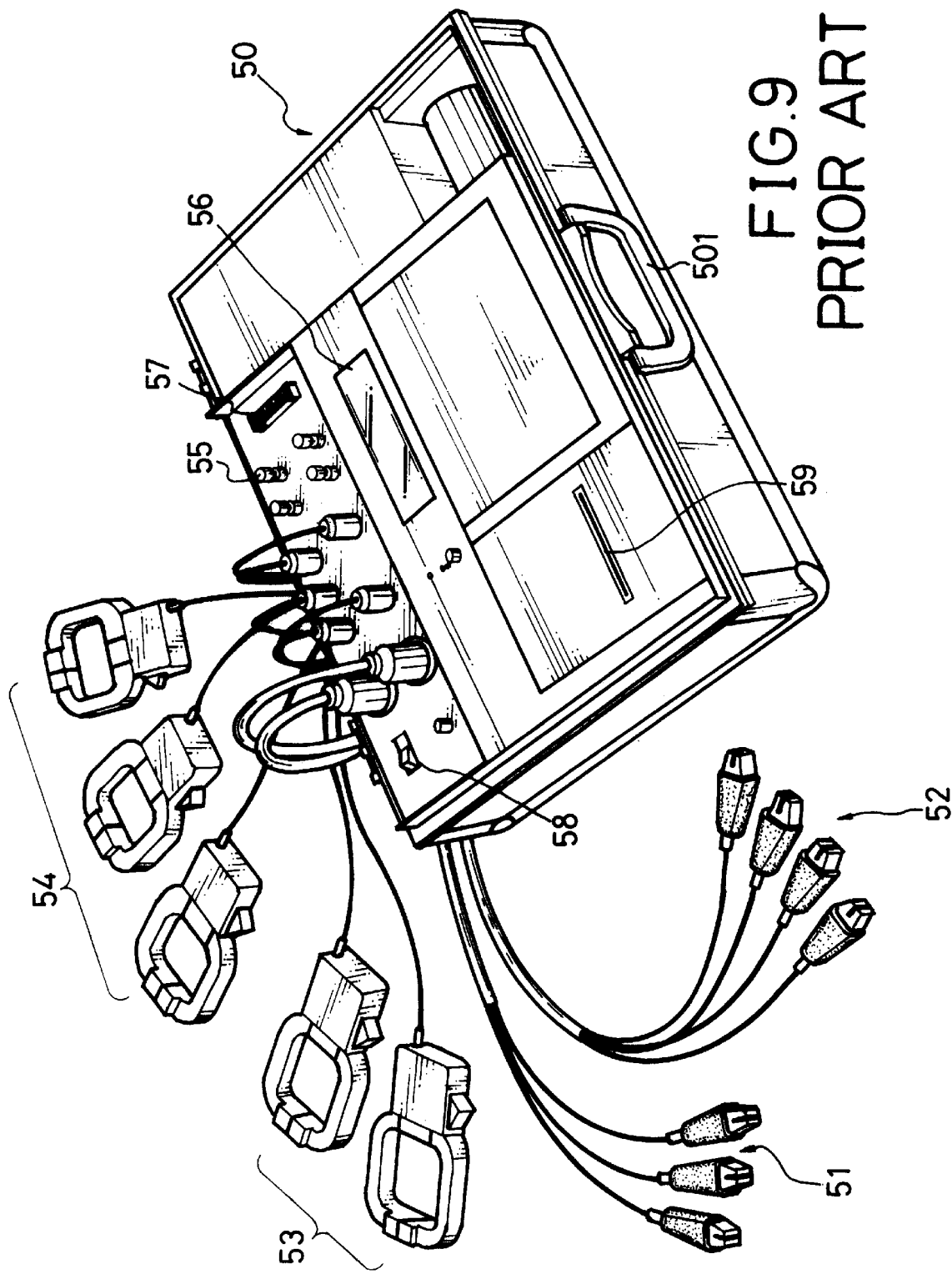
FIG. 9 is a perspective view of a power analyzer according to the prior art

As shown in FIG. 8, the power $KW_{T(L3)}$ is obtained by steps similar to those used in obtaining the power $KW_{S(L2)}$. The only differences are electrically connecting the positive test jack 17 to line T(L3) and clamping the clamp assembly 20 around line T(L3).

After the power $KW_{T(L3)}$ is obtained and shown on the display unit 15, pressing the read/next key 161 will store the power $KW_{T(L3)}$ in the memory 34 of the operating unit 30. In this embodiment, the user then will be prompted to press the read/next key 161 to further make the operating unit 30 sum the three powers stored in the memory 34, and the sum, that is, $KW_{3\Phi 4W}$, will be shown on the display unit 15.

3-Phase, 4-Line Power Factor

The steps needed in measuring a 3-phase, 4-line power factor $PF_{3\Phi 4W}$ are essentially the same as the steps in measuring a 3-phase, 4-line power, except that the apparent powers ($KVA_{R(L1)}$, $KVA_{S(L2)}$ and $KVA_{T(L3)}$), the power factors ($PF_{R(L1)}$, $PF_{S(L2)}$ and $PF_{T(L3)}$) and the reactive powers ($KVAR_{R(L1)}$, $KVAR_{S(L2)}$ and $KVAR_{T(L3)}$) of the respective phases are also calculated in their respective steps in obtaining $KW_{R(L1)}$, $KW_{S(L2)}$ and $KW_{T(L3)}$:

$$PF_{R(L1)} = KW_{R(L1)}/KVA_{R(L1)}$$

$$PF_{S(L2)} = KW_{S(L2)}/KVA_{S(L2)}$$

$$PF_{T(L3)} = KW_{T(L3)}/KVA_{T(L3)}$$

$$KVAR_{R(L1)} = (KVA_{R(L1)}^2 - KW_{R(L1)}^2)^{1/2}$$

$$KVAR_{S(L2)} = (KVA_{S(L2)}^2 - KW_{S(L2)}^2)^{1/2}$$

$$KVAR_{T(L3)} = (KVA_{T(L3)}^2 - KW_{T(L3)}^2)^{1/2}$$

After the powers and the power factors of the respective phases are obtained, the 3-phase, 4-line power factor $PF_{3\Phi 4W}$ can be obtained from:

$$KVAR_{3\Phi 4W} = KVAR_{R(L1)} + KVAR_{S(L2)} + KVAR_{T(L3)}$$

$$KVA_{3\Phi 4W} = (KW_{3\Phi 4W}^2 + KVAR_{3\Phi 4W}^2)^{1/2}$$

$$PF_{3\Phi 4W} = KW_{3\Phi 4W}/KVA_{3\Phi 4W}$$

wherein $KVAR_{3\Phi 4W}$ represents the 3-phase, 4-line reactive power, and $KVA_{3\Phi 4W}$ represents the 3-phase, 4-line apparent power.

As described above, the clamp-typed power meter in accordance with the present invention can effectively mitigate the conventional problems such as complex wiring, bulky size, and heavy weight encountered in the prior art. As the present clamp-typed power meter contains a memory capability, the total number of test clamps and test lines can be reduced to a minimum, and the advantages in easy connection and maintenance due to a reduced number thereof are evident.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

What is claimed is:

1. A clamp-type power meter for measuring three-phase electric properties, comprising:

a main body having a shape adapted to be held by hand during operation of said power meter;

a clamp assembly formed at one end of the main body to clamp around an external power line to measure a current flowing in the power line;

a first test terminal and a second test terminal provided at another end of the main body to electrically connect two external power lines to measure a voltage across the two external power lines;

an operating unit with a memory unit connected to the clamp assembly, and each of the first and the second test terminals for calculating a result from current and voltage data being measured and storing the result in the memory unit, said memory unit having a plurality of instruction messages pre-stored therein for use in measuring three-phase electric properties; and a display unit provided on the main body and connected to the operating unit to display at least one of the current data, the voltage data and the result, wherein the main body is provided with a key connected to the operating unit for storing the result in the memory unit and displaying an instruction message from the plurality of instruction messages on the display unit to prompt a user for further measurements.

2. A three-phase clamp-type power meter of claim 1, wherein the main body comprises an upper case and lower case, and said display unit is provided on the upper case of the main body.

3. A three-phase clamp-type power meter of claim 1, wherein the clamp assembly comprises a stationary arm connected to the main body and a pivoting arm connected to the main body.

4. A three-phase clamp-type power meter of claim 3, wherein the pivoting arm is integrally formed with a trigger which is biased against the main body by a spring to make the stationary and pivoting arms form an enclosed loop when released and to make the stationary and pivoting arms separate when pressed.

5. A three-phase clamp-type power meter of claim 1, wherein the main body is provided with a hold button connected to the operating unit for holding at least one of the current, the voltage and the result displayed on the display unit.

6. A three-phase clamp-type power meter of claim 1, wherein the result is selected from a group of power, phase, power factor, root-mean-square voltage and root-mean-square current.

7. A three-phase clamp-type power meter of claim 6, wherein the main body is provided with a knob connected to the operating unit for selecting the result from the group.

8. A clamp-type power meter for measuring three-phase electric properties, comprising:

a main body having a shape adapted to be held by a user's hand during operation of said power meter;

a clamp assembly formed at one end of said main body to clamp around one of a plurality of external power lines of a three-phase power distribution system to measure a current flowing in the one power line;

a first test terminal and a second test terminal provided in said main body for electrical connection to a pair of the plurality of external power lines to measure a voltage across the pair of external power lines;

an operating unit connected to the clamp assembly, and each of the first and the second test terminals for calculating a first power value from current and voltage data being measured, said operating unit including a memory unit for storing the first power value therein responsive to operation of a key connected to said operating unit, subsequent operation of said key after moving said clamp assembly to another of the plurality of external power lines and connecting said first and second test terminals to another pair of the plurality of external power lines stores at least a second power value in said memory unit, said operating unit including means for combining said stored first power value and at least said stored second power value to calculate a three-phase power value; and, a display unit provided on the main body and connected to the operating unit to display at least one of said current data, said voltage data, said first power value, at least said second power value and said three-phase power value.

9. The clamp-type power meter as recited in claim 8 where said memory unit has a plurality of instruction messages pre-stored therein, predetermined instruction messages being displayed on said display unit responsive to said operation of said key for instructing the user through measurement steps in obtaining said three-phase power value.

* * * * *